United States Patent
Sonobe et al.

(10) Patent No.: US 12,004,355 B2
(45) Date of Patent: Jun. 4, 2024

(54) MAGNETIC TUNNEL JUNCTION ELEMENT AND MAGNETORESISTIVE MEMORY DEVICE

(71) Applicant: Samsung Electronics Co., Ltd., Suwon-si (KR)

(72) Inventors: Yoshiaki Sonobe, Fujisawa (JP); Hideto Yanagihara, Tsukuba (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 241 days.

(21) Appl. No.: 17/498,023

(22) Filed: Oct. 11, 2021

(65) Prior Publication Data

US 2022/0130901 A1 Apr. 28, 2022

(30) Foreign Application Priority Data

Oct. 23, 2020 (JP) ................................ 2020-178331
Dec. 11, 2020 (KR) ........................ 10-2020-0173582

(51) Int. Cl.
*H10B 61/00* (2023.01)
*H01F 10/32* (2006.01)
*H10N 50/10* (2023.01)
*H10N 50/80* (2023.01)
*H10N 50/85* (2023.01)

(52) U.S. Cl.
CPC ......... *H10B 61/00* (2023.02); *H01F 10/3254* (2013.01); *H01F 10/3268* (2013.01); *H01F 10/3286* (2013.01); *H10N 50/10* (2023.02); *H10N 50/80* (2023.02); *H01F 10/329* (2013.01); *H10N 50/85* (2023.02)

(58) Field of Classification Search
None
See application file for complete search history.

(56) References Cited

U.S. PATENT DOCUMENTS

| 7,307,302 | B2 | 12/2007 | Saito |
| 8,107,281 | B2 | 1/2012 | Kai et al. |
| 8,786,039 | B2 * | 7/2014 | Apalkov ................ H10N 50/10 365/158 |

(Continued)

FOREIGN PATENT DOCUMENTS

| JP | 2005-032878 A | 2/2005 |
| JP | 2005-150303 A | 6/2005 |

(Continued)

OTHER PUBLICATIONS

Y. Zhang et al., 'Negative tunneling magnetoresistance of Fe/MgO/NiO/Fe magnetic tunnel junction: Role of spin mixing and interface state' *Applied Physics Letters*, vol. 111, 2017, pp. 072405-1-072405-5.

*Primary Examiner* — Kevin M Bernatz
(74) *Attorney, Agent, or Firm* — HARNESS, DICKEY & PIERCE, P.L.C.

(57) ABSTRACT

Provided is a magnetic tunnel junction element and a magnetoresistive memory device. The magnetic tunnel junction element includes a fixed layer maintaining a magnetization direction, an insulating layer, a free layer having a variable magnetization direction, and an antiferromagnetic oxide layer. The fixed layer, the free layer, and the antiferromagnetic oxide layer may be sequentially stacked. The free layer and the antiferromagnetic oxide layer may be in direct contact with each other.

18 Claims, 8 Drawing Sheets

(56) References Cited

U.S. PATENT DOCUMENTS

| | | |
|---|---|---|
| 9,184,376 B2 | 11/2015 | Park et al. |
| 9,349,944 B2 | 5/2016 | Takahashi et al. |
| 10,840,435 B2 | 11/2020 | Sonobe et al. |
| 2007/0063236 A1* | 3/2007 | Huai ............... H10N 50/85 257/E27.005 |
| 2010/0072524 A1* | 3/2010 | Huai ............... H01F 10/3268 257/295 |
| 2012/0058367 A1* | 3/2012 | Fukuma ............ G11C 11/161 430/296 |
| 2012/0205758 A1* | 8/2012 | Jan ................... B82Y 40/00 257/E29.323 |
| 2012/0276415 A1* | 11/2012 | Sapozhnikov ...... G01R 33/098 428/831 |
| 2013/0099780 A1* | 4/2013 | Ma .................. G11C 11/161 324/249 |
| 2016/0035378 A1* | 2/2016 | Quan ................ G11B 5/3912 216/22 |
| 2018/0102475 A1* | 4/2018 | Shibata .............. H03H 11/04 |
| 2018/0277745 A1 | 9/2018 | Oikawa et al. |
| 2023/0314534 A1* | 10/2023 | Prügl ................ H10N 50/85 257/421 |

FOREIGN PATENT DOCUMENTS

| | | |
|---|---|---|
| JP | 2011-071352 A | 4/2011 |
| JP | 2014-116474 A | 6/2014 |
| JP | 2015-115610 A | 6/2015 |
| JP | 2015-126218 A | 7/2015 |
| JP | 2016-063085 A | 4/2016 |
| JP | 2016-063087 A | 4/2016 |
| JP | 2016-063088 A | 4/2016 |
| JP | 2016-092066 A | 5/2016 |
| JP | 2018-133474 A | 8/2018 |
| JP | 2018-163921 A | 10/2018 |
| JP | 2020-072239 A | 5/2020 |

* cited by examiner

MAGNETIC TUNNEL JUNCTION ELEMENT AND MAGNETORESISTIVE MEMORY DEVICE

CROSS-REFERENCE TO RELATED APPLICATIONS

This application claims the benefit of Japanese Patent Application No. 2020-178331, filed on Oct. 23, 2020, in the Japanese Patent Office and Korean Patent Application No. 10-2020-0173582, filed on Dec. 11, 2020, in the Korean Intellectual Property Office, the entire disclosures of which are incorporated herein by reference.

BACKGROUND

Inventive concepts relate to a magnetic tunnel junction element and/or a magnetoresistive memory device.

Magnetoresistive devices having perpendicular magnetization and performing read-out through the magnetoresistive effect are expected to be a next-generation memory due to their high resistance to thermal disturbances against miniaturization. The magnetoresistive device includes a magnetoresistive element having a magnetic tunnel junction (MTJ) structure having a free layer having a variable magnetization direction, a fixed layer maintaining a desired and/or alternatively predetermined magnetization direction, and an insulating layer between the free layer and the fixed layer.

Although ferromagnetic materials having high perpendicular magnetic anisotropy and high spin polarization may be required as basic constituent materials of the next-generation memory, there are few materials that have perpendicular magnetic anisotropy and experimentally high spin polarization. Practically, there is only a CoFeB metal ferromagnetic material that has perpendicular magnetic anisotropy by using interfacial magnetic anisotropy, so that the range of material selection is very narrow. Therefore, it is practically difficult to use a material having a high perpendicular magnetic anisotropy and a high spin polarization rate. As a solution to the above problem, a method of coupling a perpendicular magnetization holding layer to a magnetic tunnel junction element has been proposed.

For example, a Heusler alloy film, which is a material having a high spin polarization in contact with an insulating layer such as MgO is used as a memory layer composed of such a composite film, and a huge tunnel magnetoresistive ratio is expected in a magnetic tunnel junction element using the films. Furthermore, the thermal stability of magnetization is improved by combining FePt, Co/Pt, MnGa, and MnGe perpendicular magnetization holding layers. Furthermore, an ECC structure, a TcC structure, and the like capable of controlling magnetic coupling, holding the thermal stability of magnetization, and reducing a magnetization reversal current, by including a magnetic coupling control layer between two magnetic layers, have been proposed. The TcC structure is a structure in which the Curie (Tc) temperature of the perpendicular holding layer is reduced.

As a drawback of the TcC structure, there is a problem that thermal stability is deteriorated at a high use temperature. In other words, the reason for the poor thermal stability at a high temperature is that the magnetic anisotropy rapidly deteriorates as the temperature increases because the TcC structure uses a high magnetic anisotropy layer having a small Tc as the vertical holding layer.

In addition, a structure of a composite film-type recording layer including a high polarization layer having high perpendicular magnetic anisotropy, as a recording layer, and a magnetic layer (hereinafter, referred to as an AFC layer) in the opposite direction to the recording layer and the high polarization layer has also been proposed. The structure may reduce a write current in a high-speed area.

SUMMARY

However, as all of the structures are multilayered, there may be a problem that optimization may be very difficult. Furthermore, as a task for practical use, a magnetic tunnel junction element having low power, high speed inversion, and high reliability that may be used even at a wide operating temperature of $-40°$ C. to $+150°$ C. may be required.

A magnetic tunnel junction element according to an embodiment of inventive concepts may include a fixed layer maintaining a magnetization direction, an insulating layer, a free layer having a variable magnetization direction, and an antiferromagnetic oxide layer in direct contact with the free layer. The fixed layer, the free layer, and the antiferromagnetic oxide layer may be sequentially stacked.

In example embodiments, the magnetic tunnel junction element may have low power, high-speed reversal, and high reliability and may be used at a wide operating temperature of about $-40°$ C. to about $+150°$ C.

In example embodiments, a magnetic anisotropy of the free layer may be in a direction perpendicular to a stack surface. The direction perpendicular to the stack surface may extend from a lower surface to an upper surface of a stack structure including the fixed layer, the free layer, the insulating layer, and the antiferromagnetic oxide.

Due to an increase in perpendicular magnetic anisotropy of magnetism in the free layer, reliability may be obtained at a high operating temperature.

In some example embodiments, a direction of a bias magnetic field generated from the antiferromagnetic oxide layer may be parallel to a stack surface.

As a bias magnetic field in an in-plane direction may be simultaneously obtained with respect to the perpendicular magnetization of the free layer, reversal may be available with a small write current value, thereby obtaining low power and high speed.

In some example embodiments, an electrical resistance of the antiferromagnetic oxide layer may be less than an electrical resistance of the insulating layer.

As an electrical resistance of NiO is small, a write current may be decreased. Although both of insulating layers MgO and NiO are insulating bodies, as a bandgap is about 7.8 eV and about 4.2 eV, respectively, an electrical resistance may be decreased compared to a non-magnetic insulating layer.

In some example embodiments, a thickness of the antiferromagnetic oxide layer may be greater than or equal to about 0.5 nm and less than or equal to about 2 nm.

In some example embodiments, an optimal NiO thickness may be set to obtain an in-plane direction bias magnetic field.

A magnetoresistive memory device according to an embodiment of inventive concepts includes a magnetic tunnel junction element and an electrode configured to apply a voltage to the magnetic tunnel junction element. The magnetic tunnel junction element may include a fixed layer maintaining a magnetization direction, an insulating layer, a free layer having a variable magnetization direction, and an antiferromagnetic oxide layer in direct contact with the free layer. The fixed layer, the free layer, and the antiferromagnetic oxide layer may be sequentially stacked.

The magnetoresistive memory device may have low power, high-speed reversal, and high reliability. The magnetoresistive memory device may be used at a wide operating temperature of about −40° C. to about +150° C.

BRIEF DESCRIPTION OF THE DRAWINGS

Embodiments of inventive concepts will be more clearly understood from the following detailed description taken in conjunction with the accompanying drawings in which.

DETAILED DESCRIPTION OF THE EMBODIMENTS

When the term "about" is used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, example embodiments of inventive concepts are described with reference to the accompanying drawings.

Figure 1:
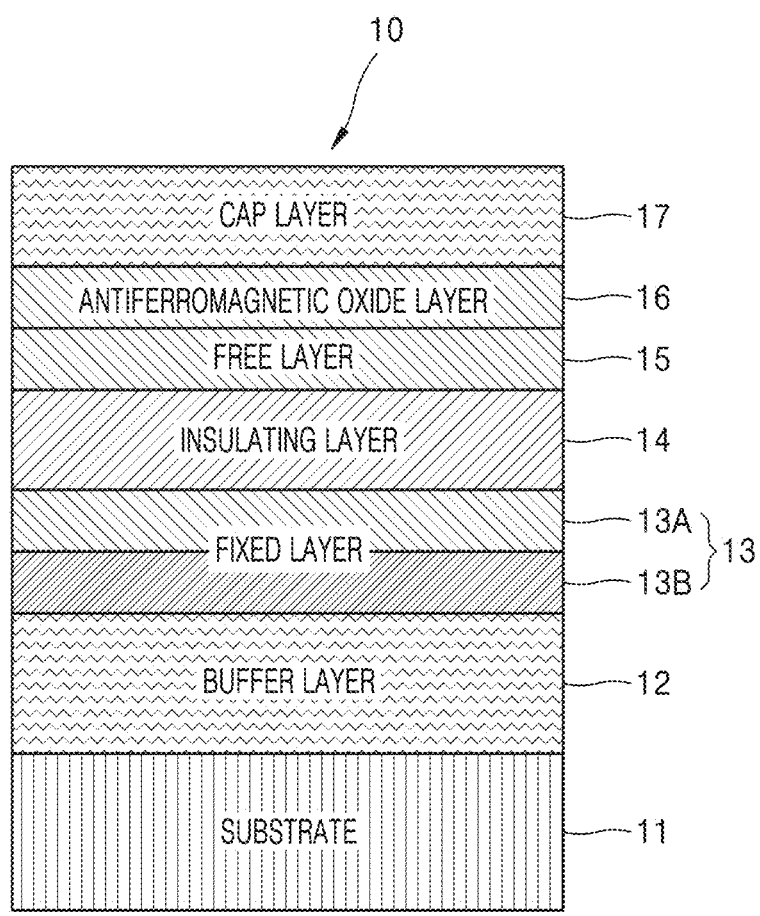
FIG. 1 is a cross-sectional view of a structure of a magnetic tunnel junction element according to an embodiment of inventive concepts.

FIG. 1 is a cross-sectional view of a structure of a magnetic tunnel junction element 10 according to an embodiment.

The magnetic tunnel junction element 10 may include a substrate 11, a buffer layer 12, a fixed layer 13, an insulating layer 14, a free layer 15, an antiferromagnetic oxide layer 16, and a cap layer 17. In the magnetic tunnel junction element 10, the substrate 11, the buffer layer 12, the fixed layer 13, the insulating layer 14, the free layer 15, the antiferromagnetic oxide layer 16, and the cap layer 17 are sequentially stacked.

The substrate 11 may be a semiconductor substrate, such as a Si substrate. For example, the substrate may be a Si single crystal substrate. In some embodiments, the substrate 11 may be and/or may include an insulator, such as a thermal oxide film Si substrate.

The buffer layer 12 may be a stabilization layer formed on the substrate 11. In detail, the buffer layer 12 may include Ru, Cr, Ta, Au, W, Pt, or Ti, or a combination thereof.

The fixed layer 13 may maintain a magnetization direction in a direction. The fixed layer 13 may include a material having a magnetization direction that is not easily changed with respect to the free layer 15. In other words, the fixed layer 13 may include a material that has high effective magnetic anisotropic ($Ku_{eff}$) and saturation magnetization (Ms), and a high magnetic relaxation constant α.

However, the material of the fixed layer 13 is not particularly limited, and may be selected from any materials according to a manufacturing method. For example, the fixed layer 13 may include a layer 13A and a Co/Pt multilayer film 13B, the layer 13A having CoFeB as a main component. Furthermore, the layer 13A may be a layer having a Heusler alloy film as a main element. The layer 13A having a Heusler alloy film as a main element may be a layer having a Co-based full-Heusler alloy as a main component. In detail, the Co-based full-Heusler alloy may include $Co_2FeSi$, $Co_2MnSi$, $Co_2FeMnSi$, $Co_2FeAl$, or $Co_2CrAl$. Furthermore, the Co/Pt multilayer film 13B may be included for high perpendicular magnetic anisotropy. As illustrated in FIG. 1, the layer 13A having a Heusler alloy film as a main element is bonded to the insulating layer 14, and the Co/Pt multilayer film 13B is bonded to the buffer layer 12. As the fixed layer 13 is formed to have any one of the above-described configurations, the fixed layer 13 may serve as a layer that maintains a magnetization direction in a certain direction in a single layer. Furthermore, the fixed layer 13 may be referred to as a reference layer.

The insulating layer 14 may include an insulation material as a main component. The insulating layer 14 may have a (001) texture. The insulating layer 14 may be provided between the fixed layer 13 having ferromagnetism and the free layer 15. The insulating layer 14 may include MgO and the like. Furthermore, an oxide having an NaCl structure may be used as a material of the insulating layer 14, and in addition to the above-described MgO, CaO, SrO, TiO, VO, NbO, and the like may be used, but inventive concepts is not particularly limited thereto unless the material does not interfere with the function of the insulating layer 14. For example, spinel-type $MgAl_2O_4$ and the like may be used as well. As a voltage is perpendicularly applied to the bonding surface of the fixed layer 13 and the free layer 15, a current may flow in the magnetic tunnel junction element 10 due to a tunnel effect.

The free layer 15 has an easy magnetization axis in a direction perpendicular to a stack surface (e.g., film surface such as an upper surface of the free layer), and has a variable magnetization direction due to a magnetization rotation. Furthermore, the free layer 15 may be referred to as a memory layer. The free layer 15 may be perpendicularly magnetized, for example, to the stack surface (film surface), and oriented upward or downward. The material of the free layer 15 is not particularly limited, and may be selected from any materials according to a manufacturing method. For example, the free layer 15 may include CoFeB as a main component. Furthermore, the free layer 15 may include a Co-based full-Heusler alloy. In detail, the Co-based full-Heusler alloy may include $Co_2FeSi$, $Co_2MnSi$, $Co_2(Fe-Mn)Si$, $Co_2FeAl$, or $Co_2CrAl$. Furthermore, the free layer 15 may include a MnGaGe-based material having low saturation magnetization (Ms), or a FeNi-based material having relatively low magnetic anisotropy (Ku).

The antiferromagnetic oxide layer 16 may have an antiferromagnetism property. The antiferromagnetic oxide layer 16 may be in direct contact with the free layer 15. For example, the antiferromagnetic oxide layer 16 may include NiO. Furthermore, the antiferromagnetic oxide layer 16 may include an oxide in which δ<0.1.

For example, the antiferromagnetic oxide layer 16 may include CoO, a mixture of NiO and CoO, NiO+VO, or a combination of MnO, CoO, and CuO. A direction of a bias magnetic field generated from the antiferromagnetic oxide layer 16 may be a parallel direction in the stack surface. Furthermore, the electrical resistance of the antiferromagnetic oxide layer 16 may be less than that of the insulating layer 14. Furthermore, the thickness of the antiferromagnetic oxide layer 16 may be greater than or equal to about 0.5 nm and less than or equal to about 2 nm.

The cap layer 17 may be a stabilization layer formed on the free layer 15. For example, the cap layer 17 may include Ru.

Next, a relationship between the thickness of the free layer 15 and the force of a magnetic coupling (bias magnetic field) is described.

FIGS. 2 to 5 are graphs of a relationship between a magnetic flux density and ρ AHE. In FIGS. 2 to 5, the horizontal axis denotes a magnetic flux density $\mu_0 H$. Furthermore, the vertical axis denotes ρ AHE. In FIGS. 2 to 5, a graph shows a case in which the free layer 15 includes Fe and the antiferromagnetic oxide layer 16 includes NiO.

Figure 2:
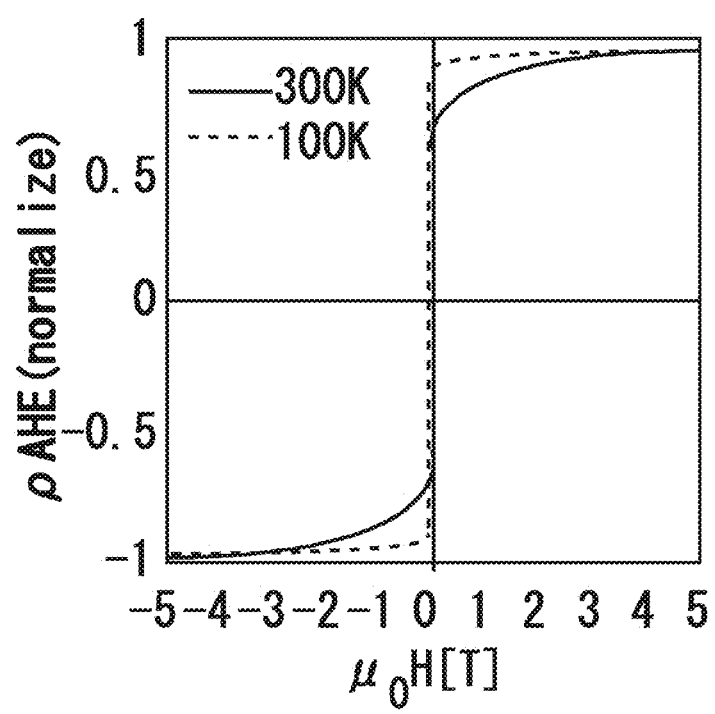
FIG. 2 is a graph of a relationship between a magnetic flux density and ρ anomalous hall resistivity (AHE) when the thickness of the free layer is about 0.6 nm.

FIG. 2 is a graph of a relationship between a magnetic flux density and ρ AHE when the thickness of the free layer 15 is about 0.6 nm. In FIG. 2, the free layer 15 exhibits perpendicular magnetic anisotropy and becomes a perpendicular magnetization film. Furthermore, when a temperature is lowered from 300 K to 100 K, an angled shape becomes better.

Figure 3:
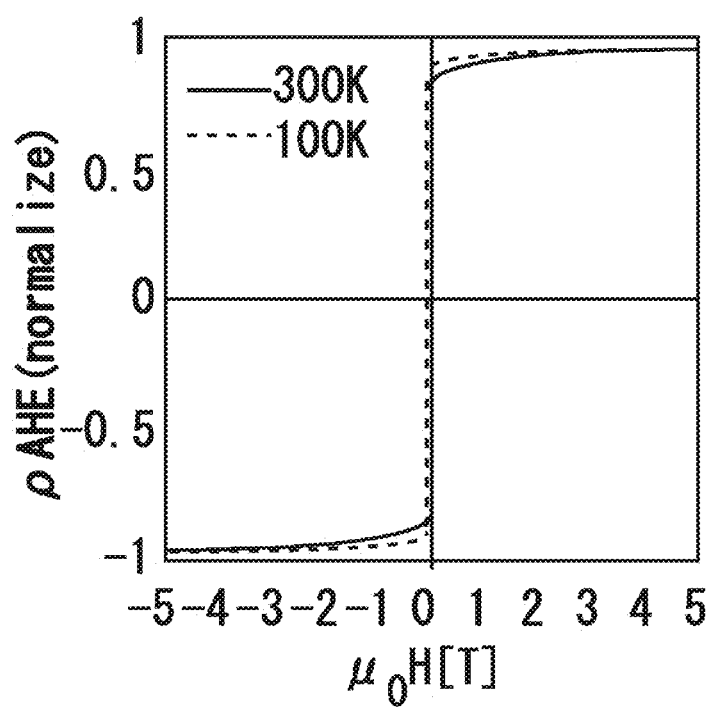
FIG. 3 is a graph of a relationship between a magnetic flux density and ρ AHE when the thickness of the free layer is about 0.8 nm.

FIG. 3 is a graph of a relationship between a magnetic flux density and ρ AHE when the thickness of the free layer 15 is about 0.8 nm. In FIG. 3, the free layer 15 exhibits perpendicular magnetic anisotropy and becomes a complete perpendicular magnetization film. Furthermore, when a temperature is lowered from 300K to 100K, a slight coercivity of about 0.1 T is obtained.

Figure 4:
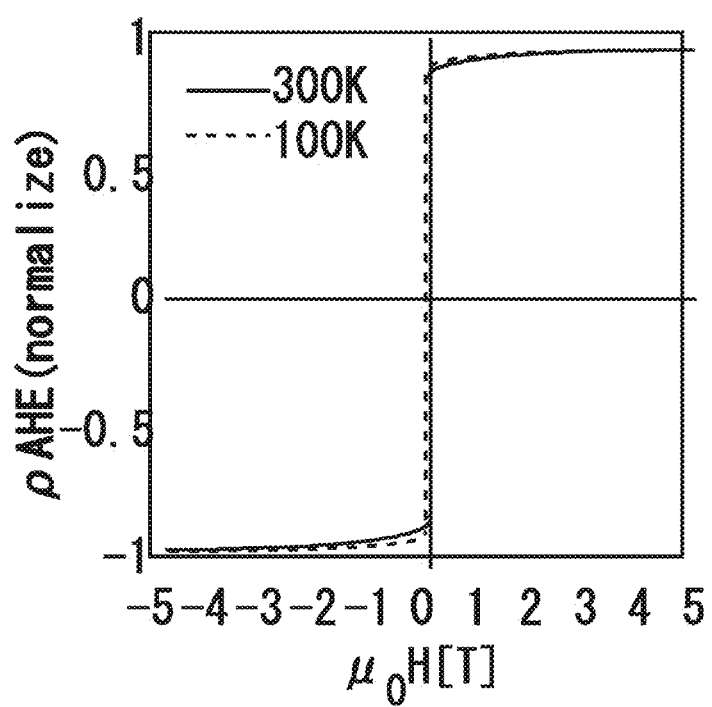
FIG. 4 is a graph of a relationship between a magnetic flux density and ρ AHE when the thickness of the free layer is about 1.0 nm.

FIG. 4 is a graph of a relationship between a magnetic flux density and ρ AHE when the thickness of the free layer 15 is about 1.0 nm. In FIG. 4, the free layer 15 exhibits perpendicular magnetic anisotropy and becomes a complete perpendicular magnetization film. Furthermore, when a temperature is lowered from 300K to 100K, a slight coercivity is obtained.

Figure 5:
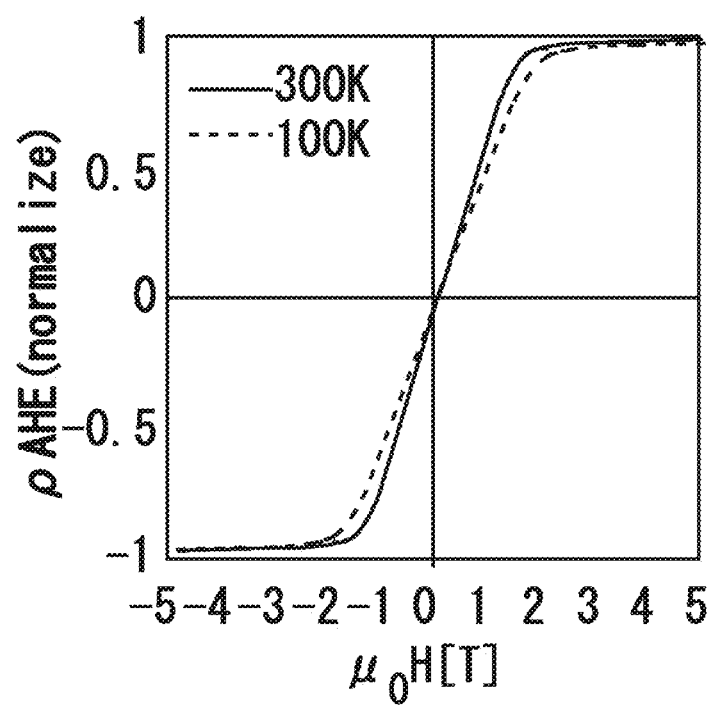
FIG. 5 is a graph of a relationship between a magnetic flux density and ρ AHE when the thickness of the free layer is about 1.6 nm.

FIG. 5 is a graph of a relationship between a magnetic flux density and ρ AHE when the thickness of the free layer 15 is about 1.6 nm. In FIG. 5, the free layer 15 is an in-plane magnetization film. Furthermore, a saturation magnetic field is slightly greater at a temperature of 100 K than a temperature of 300 K.

Next, a relationship between a magnetic coupling of the antiferromagnetic body to the memory layer and a magnetic reversal speed is described by using an LLG simulation.

The LLG simulation is performed under the following conditions.

$H_b = 2A/Msd^2$ ($H_b$ is a bias magnetic field)

$Ms = 800$ emu/cm³

(Ms is a saturation magnetization Ms of the free layer 15)

$d = 5 \cdot 10^{-8}$ cm (d: the thickness of the free layer 15 affected by the bias magnetic field $H_b$ generated from the antiferromagnetic oxide layer 16)

Figure 6:
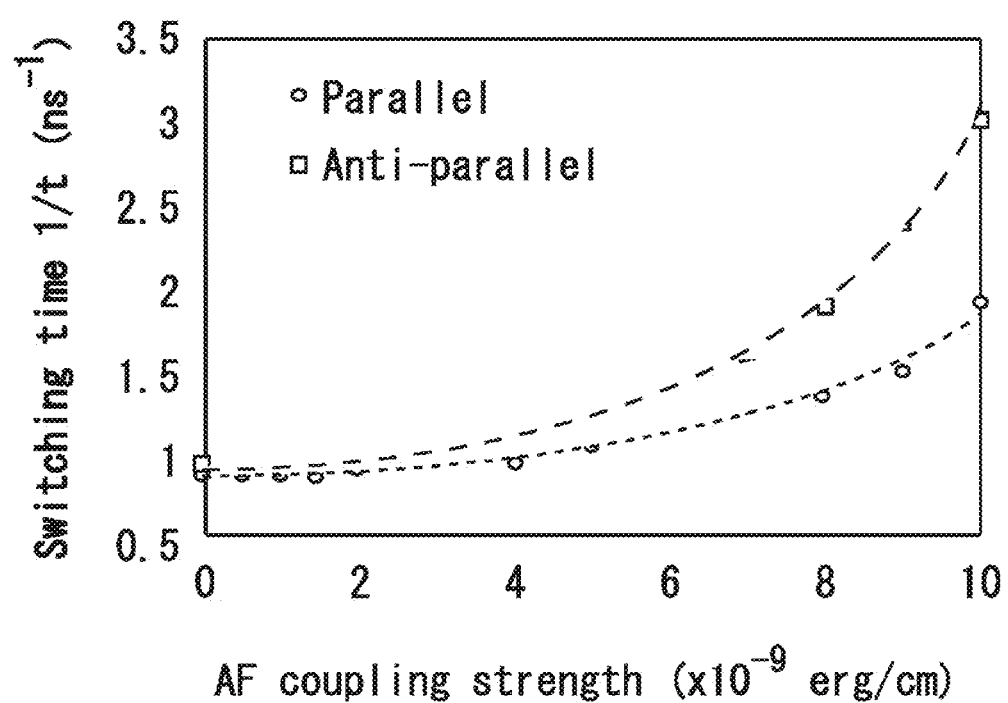
FIG. 6 is a graph of a relationship between a magnetic coupling of an antiferromagnetic oxide layer to a free layer and a magnetic reversal time.

A result of the LLG simulation is illustrated in FIG. 6. FIG. 6 is a graph of a relationship between a magnetic coupling of the antiferromagnetic oxide layer 16 to the free layer 15 and a magnetic reversal time.

In FIG. 6, the horizontal axis denotes the magnetic coupling of the antiferromagnetic oxide layer 16 to the free layer 15. Furthermore, the vertical axis denotes a reciprocal of the magnetic reversal time. When the antiferromagnetic oxide layer 16 is not provided, the magnetic coupling of the antiferromagnetic oxide layer 16 to the free layer 15 is 0 (zero).

In other words, as the antiferromagnetic oxide layer 16 is in direct contact with the free layer 15, and the magnetic coupling increases, the reciprocal of the magnetic reversal time increases, that is, magnetic reversal is made at a fast speed.

As such, as the magnetic tunnel junction element 10 according to an embodiment includes the antiferromagnetic oxide layer 16 in direct contact with the free layer 15, the magnetic coupling between the antiferromagnetic oxide layer 16 and the free layer 15 increases, and thus, the magnetic tunnel junction element 10 may have low power, high-speed reversal, and high reliability so as to be used at a wide operating temperature of about −40° C. to about +150° C.

2. Embodiment 2

Another embodiment of inventive concepts, in which the antiferromagnetic oxide layer 16 is provided between the insulating layer 14 and the free layer 15, is described.

Figure 7:
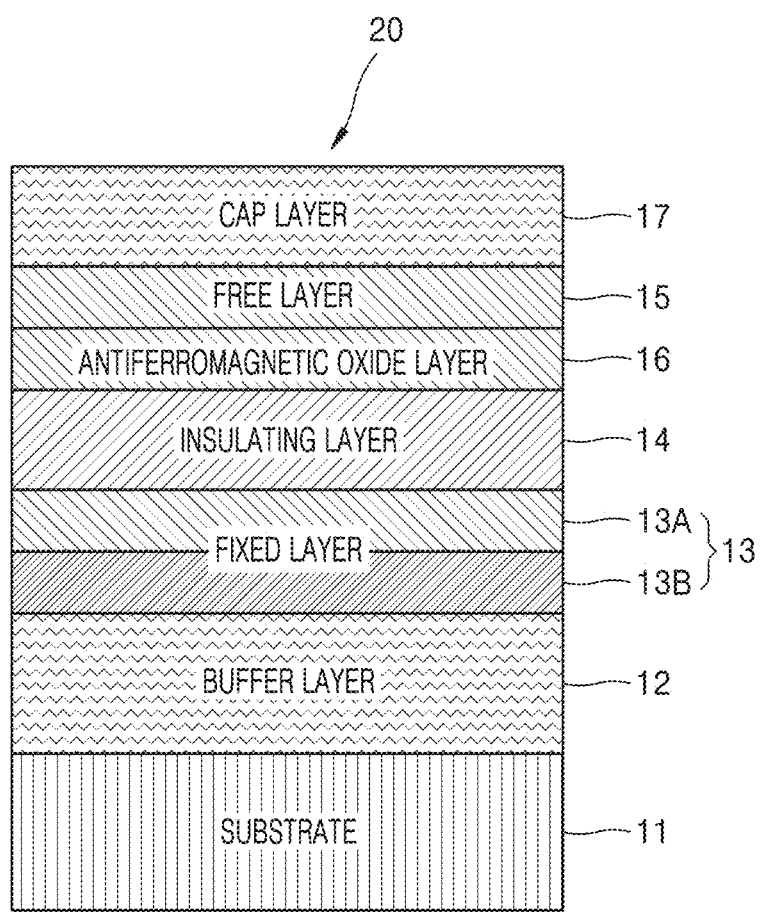
FIG. 7 is a cross-sectional view of a structure of a magnetic tunnel junction element according to another embodiment of inventive concepts.

FIG. 7 is a cross-sectional view of a structure of a magnetic tunnel junction element 20 according to another embodiment of inventive concepts.

In FIGS. 1 and 7, like reference numerals denote like elements, and descriptions thereof are omitted. The magnetic tunnel junction element 20 may include the substrate 11, the buffer layer 12, the fixed layer 13, the insulating layer 14, the free layer 15, the antiferromagnetic oxide layer 16, and the cap layer 17. In the magnetic tunnel junction element 20, the substrate 11, the buffer layer 12, the fixed layer 13, the insulating layer 14, the antiferromagnetic oxide layer 16, the free layer 15, and the cap layer 17 are sequentially stacked. Furthermore, the antiferromagnetic oxide layer 16 is in direct contact with the free layer 15.

As such, the magnetic tunnel junction element 20 according to another embodiment may have low power, high-speed reversal, and high reliability so as to be used at a wide operating temperature of about −40° C. to about +150° C.

3. Embodiment 3

Another embodiment of inventive concepts, that is, a magnetoresistive memory device using the magnetic tunnel junction element according to the above-described embodiments, is described.

Figure 8:
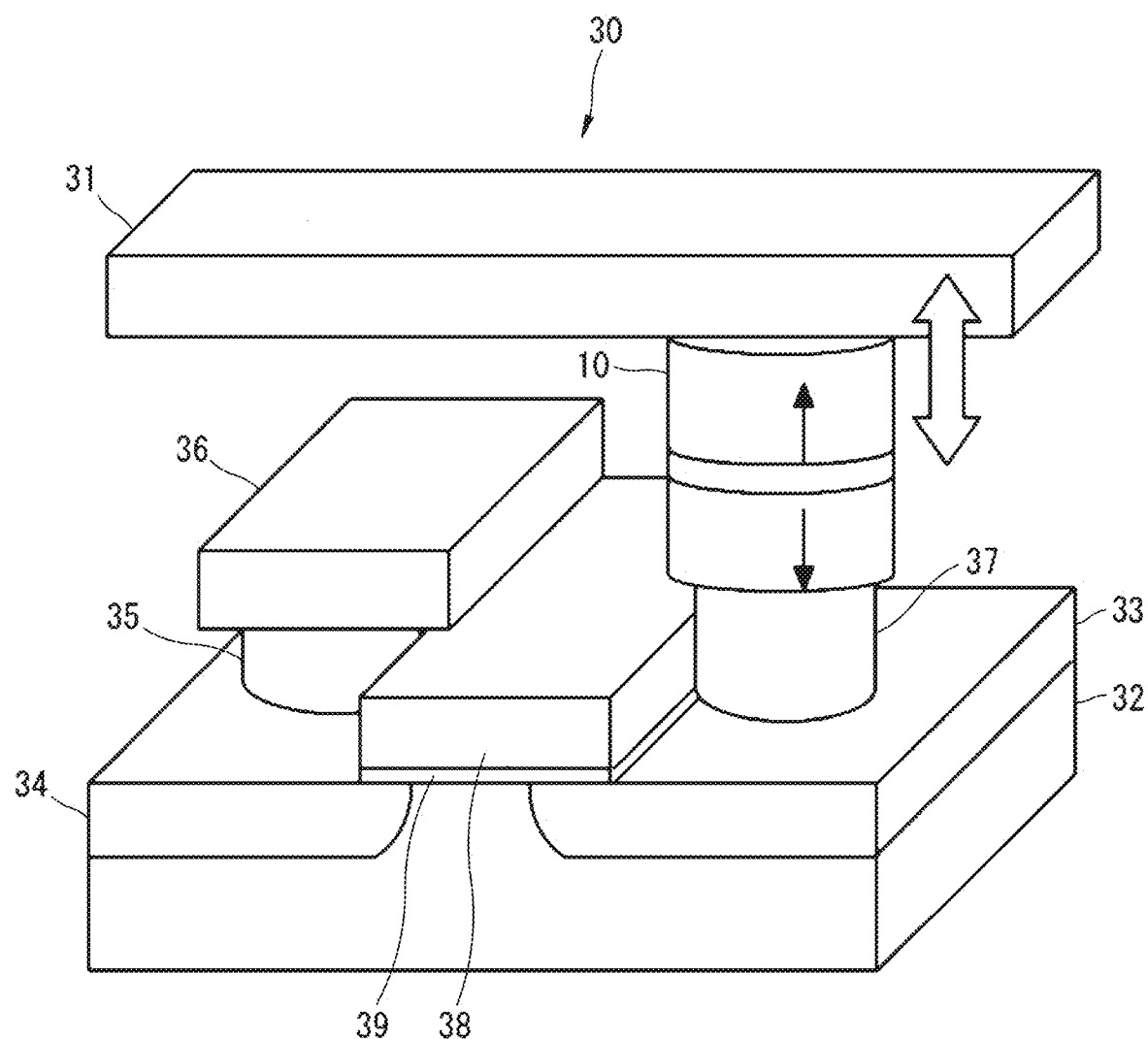
FIG. 8 is a perspective view of a main portion of a magnetoresistive memory device according to another embodiment of inventive concepts.

FIG. 8 is a perspective view of a main portion of a magnetoresistive memory device according to another embodiment of inventive concepts.

In FIG. 8, the magnetoresistive memory device may include a memory cell 30, a bit line 31, contact plugs 35 and 37, and a word line 38.

The memory cell 30 may include a semiconductor substrate 32, diffusion regions 33 and 34, a source line 36, a gate insulating film 39, and the magnetic tunnel junction element 10. The magnetic tunnel junction element 10 may correspond to the magnetic tunnel junction element 10 of the embodiment or to the magnetic tunnel junction element 20 of another embodiment.

The magnetoresistive memory device may include a plurality of memory cells 30 arranged in a matrix form, which are connected to each other by using the bit line 31 provided as a plurality of lines and the word line 38 provided as a plurality of lines. MRAM performs a data write process by using a spin torque injection method.

The semiconductor substrate 32 may have the diffusion regions 33 and 34 in an upper surface thereof, and the diffusion region 33 is arranged apart from the diffusion region 34 with an interval. The diffusion region 33 functions as a drain region, and the diffusion region 34 functions as a source region. The diffusion region 33 is connected to the magnetic tunnel junction element 10 via the contact plug 37.

The bit line 31 is arranged above the semiconductor substrate 32 and also connected to the magnetic tunnel junction element 10. The bit line 31 is connected to a write circuit (not shown) and a read-out circuit (not shown).

The diffusion region 34 is connected to the source line 36 via the contact plug 35. The source line 36 is connected to the write circuit and the read-out circuit.

The word line 38 is arranged on the semiconductor substrate 32 via the gate insulating film 39 to be in contact with the diffusion region 33 and the diffusion region 34. The word line 38 and the gate insulating film 39 function as select transistors. The word line 38 is activated as a current is supplied from a circuit (not shown), and is turned on as a select transistor.

In the magnetoresistive memory device configured as above, as the bit line 31 and the diffusion region 33, as electrodes, apply a voltage to the magnetic tunnel junction element 10, spin torque of electrodes oriented in a direction by the application of a voltage changes the magnetization direction of a ferromagnetic layer. By changing a current direction, the value of data written on the magnetoresistive memory device may be changed.

As such, the magnetic tunnel junction element 10 according to another embodiment may have low power, high-speed reversal, and high reliability so as to be used at a wide operating temperature of about −40° C. to about +150° C.

Inventive concepts are not limited to the above embodiments and may be appropriately changed without departing from the scope of inventive concepts. For example, the magnetoresistive device according to inventive concepts may include other layers respectively between the substrate, the buffer layer, the fixed layer, the insulating layer, the free layer, and the cap layer, without impairing the function of each layer of inventive concepts. For example, a layer to adjust a lattice mismatch between layers or a layer to eliminate lattice defects may be added. Furthermore, the substrate may be disposed on the side of the free layer when viewed from the insulating layer.

While inventive concepts have been particularly shown and described with reference to embodiments thereof, it will be understood that various changes in form and details may be made therein without departing from the spirit and scope of the following claims.

What is claimed is:

1. A magnetic tunnel junction element comprising:
    a fixed layer maintaining a magnetization direction;
    an insulating layer;
    a free layer having a variable magnetization direction; and
    an antiferromagnetic oxide layer in direct contact with the free layer, wherein
    the fixed layer, the free layer, the insulating layer, and the antiferromagnetic oxide layer are sequentially stacked,
    a thickness of the antiferromagnetic oxide layer is greater than or equal to about 0.5 nm and less than or equal to about 2 nm, and
    wherein an electrical resistance of the antiferromagnetic oxide layer is less than an electrical resistance of the insulating layer.

2. The magnetic tunnel junction element of claim 1, wherein
    a magnetic anisotropy of the free layer is in a direction perpendicular to a stack surface, and
    the direction perpendicular to the stack surface extends from a lower surface to an upper surface of a stack structure including the fixed layer, the free layer, the insulating layer, and the antiferromagnetic oxide layer.

3. The magnetic tunnel junction element of claim 2, wherein
    a direction of a bias magnetic field generated from the antiferromagnetic oxide layer is parallel to the stack surface, and
    a direction parallel to the stack surface is parallel to the lower surface of a stack structure.

4. The magnetic tunnel junction element of claim 1, wherein
    a thickness of the free layer is greater than or equal to about 0.6 nm and less than or equal to about 1 nm,
    a magnetic anisotropy of the free layer is in a direction perpendicular to a stack surface, and
    the direction perpendicular to the stack surface extends from a lower surface to an upper surface of a stack structure including the fixed layer, the free layer, the insulating layer, and the antiferromagnetic oxide layer.

5. The magnetic tunnel junction element of claim 1, the antiferromagnetic oxide layer includes CoO, a mixture of NiO and CoO, NiO and VO, or a combination of MnO, CoO, and CuO.

6. The magnetic tunnel junction element of claim 1, wherein
    a thickness of the free layer is about 0.6 nm to about 1 nm.

7. The magnetic tunnel junction element of claim 1, wherein
    the fixed layer includes a first fixed layer and a second fixed layer on the first fixed layer,
    the first fixed layer includes CoFeB as a main component,
    the second fixed layer includes a Co/Pt multilayer film,
    the second fixed layer is on the first fixed layer, and
    the second fixed layer is between the first fixed layer and the insulating layer.

8. The magnetic tunnel junction element of claim 7, wherein the insulating layer includes one of MgO, CaO, SrO, ViO, VO, NbO, or $MgAl_2O_4$.

9. The magnetic tunnel junction element of claim 7, wherein
    the first fixed layer further includes a Co-based full-Heusler alloy,
    the free layer includes a Co-based full-Heusler alloy, a MnGaGe-based material, or a FeNi-based material.

10. A magnetoresistive memory device comprising:
    a magnetic tunnel junction element including a fixed layer maintaining a magnetization direction, an insulating layer, a free layer having a variable magnetization direction, and an antiferromagnetic oxide layer in direct contact with the free layer, wherein the fixed layer, the insulating layer, the free layer, and the antiferromagnetic oxide layer are sequentially stacked, a thickness of the antiferromagnetic oxide layer is greater than or equal to about 0.5 nm and less than or equal to about 2 nm; and an electrode configured to apply a voltage to the magnetic tunnel junction element, wherein an electrical resistance of the antiferromagnetic oxide layer is less than an electrical resistance of the insulating layer.

11. The magnetoresistive memory device of claim 10, wherein a magnetic anisotropy of the free layer is in a direction perpendicular to a stack surface, and the direction perpendicular to the stack surface extends from a lower surface to an upper surface of a stack structure including the fixed layer, the free layer, the insulating layer, and the antiferromagnetic oxide layer.

12. The magnetoresistive memory device of claim 11, wherein a direction of a bias magnetic field generated from the antiferromagnetic oxide layer is parallel to the stack surface, and a direction parallel to the stack surface is parallel to the lower surface of the stack structure.

13. The magnetoresistive memory device of claim 10, wherein a thickness of the free layer is greater than or equal to about 0.6 nm and less than or equal to about 1 nm, a magnetic anisotropy of the free layer is in a direction perpendicular to a stack surface, and the direction perpendicular to the stack surface extends from a lower surface to an upper surface of a stack structure including the fixed layer, the free layer, the insulating layer, and the antiferromagnetic oxide layer.

14. The magnetoresistive memory device of claim 13, wherein the antiferromagnetic oxide layer includes CoO, a mixture of NiO and CoO, NiO and VO, or a combination of MnO, CoO, and CuO.

15. The magnetoresistive memory device of claim 10, wherein a thickness of the free layer is about 0.6 nm to about 1 nm.

16. The magnetoresistive memory device of claim 10, wherein the fixed layer includes a first fixed layer and a second fixed layer on the first fixed layer, the first fixed layer includes CoFeB as a main component, the second fixed layer includes a Co/Pt multilayer film, the second fixed layer is on the first fixed layer, and the second fixed layer is between the first fixed layer and the insulating layer.

17. The magnetoresistive memory device of claim 10, wherein the insulating layer includes one of MgO, CaO, SrO, ViO, VO, NbO, or $MgAl_2O_4$.

18. The magnetoresistive memory device of claim 10, wherein the fixed layer further includes a Co-based full-Heusler alloy, the free layer includes a Co-based full-Heusler alloy, a MnGaGe-based material, or a FeNi-based material.

* * * * *